United States Patent
Chen

(10) Patent No.: US 10,052,664 B2
(45) Date of Patent: Aug. 21, 2018

(54) MASK-CLEANING APPARATUS

(71) Applicant: Ming-Sheng Chen, Taichung (TW)

(72) Inventor: Ming-Sheng Chen, Taichung (TW)

( * ) Notice: Subject to any disclaimer, the term of this patent is extended or adjusted under 35 U.S.C. 154(b) by 292 days.

(21) Appl. No.: 14/966,277

(22) Filed: Dec. 11, 2015

(65) Prior Publication Data

US 2017/0165719 A1  Jun. 15, 2017

(51) Int. Cl.
*B08B 1/00* (2006.01)
*B08B 1/04* (2006.01)
*B08B 1/02* (2006.01)

(52) U.S. Cl.
CPC .......... *B08B 1/006* (2013.01); *B08B 1/00* (2013.01); *B08B 1/008* (2013.01); *B08B 1/02* (2013.01); *B08B 1/04* (2013.01); *B08B 2240/00* (2013.01)

(58) Field of Classification Search
CPC ....... B08B 1/006; B08B 2240/00; B08B 1/02; B08B 1/04
USPC .................................................. 15/97.1, 100
See application file for complete search history.

(56) References Cited

U.S. PATENT DOCUMENTS

| | | | |
|---|---|---|---|
| 5,078,162 A * | 1/1992 | Moody | B08B 9/0433 134/104.1 |
| 2012/0325267 A1* | 12/2012 | Benson | B08B 1/02 134/9 |
| 2016/0041345 A1* | 2/2016 | Kamouchi | G02B 6/3866 15/97.1 |

* cited by examiner

*Primary Examiner* — Michael Jennings

(57) ABSTRACT

A mask-cleaning apparatus includes a frame, a wet cleaning mechanism supported on the frame, and a dry cleaning mechanism supported on the frame and located after the wet cleaning mechanism in a direction of feeding a clean-room wiper. The wet cleaning mechanism wipes a mask before the dry cleaning mechanism wipes the mask. Each of the wet and dry cleaning mechanisms includes a wiping module that includes a vertical plate, a feeder reel, a retriever reel, direction-changing rollers and a pushing roller. The wiping module of the wet cleaning mechanism includes a sprayer mechanism adapted for spraying cleaning liquid onto a portion of the clean-room wiper on the pushing roller.

11 Claims, 6 Drawing Sheets

MASK-CLEANING APPARATUS

BACKGROUND OF INVENTION

1. Field of Invention

The present invention relates to cleaning of a mask and, more particularly, to a fast and effective apparatus for cleaning the surface of a mask to increase the yield of a process for producing semiconductor.

2. Related Prior Art

Conventionally, a worker cleans the surface of a mask by hand. The worker puts the mask on a holder, uses cleaner liquid such as acetone, ethanol and de-ionized water to flush the surface of the mask, and uses a brush to brush the surface of the mask, trying to remove particles from the surface of the mask. The step of using the cleaner liquid to flush the surface of the mask and the step of using the brush to brush the surface of mask can be repeated for several times if necessary. Then, the worker uses the cleaner liquid to flush the surface of the mask one last time before he or she dries the surface of the mask. Such a cleaning process is intended to clean the surface of the mask of impurities and sediment. This cleaning process however puts the worker in the risks of excessive exposure to the cleaner liquid, which is based on organic solvent that is hazardous to human health.

To solve the foregoing problem, various automatic mask-cleaning apparatuses have been devised. A large amount of cleaner liquid based on organic solvent is still used in the automatic mask-cleaning apparatuses although human exposure to the cleaner liquid is reduced. Hence, there are still problems with control over the cleaner liquid and pollution related to the use of the cleaner liquid. Moreover, the cleaning is not effective because the cleaning is based on flushing.

The present invention is therefore intended to obviate or at least alleviate the problems encountered in prior art.

SUMMARY OF INVENTION

It is an objective of the present invention to provide a fast, effective, safe, environmentally friendly and inexpensive apparatus for cleaning the surface of a mask via wiping without having to use a large amount of cleaner liquid based on organic solvent.

It is another objective of the present invention to provide an apparatus for washing and dry cleaning to clean a mask of particles or stains without leaving any water stain.

To achieve the foregoing objectives, the mask-cleaning apparatus includes a frame, a wet cleaning mechanism supported on the frame, and a dry cleaning mechanism supported on the frame and located after the wet cleaning mechanism in a direction of feeding a clean-room wiper. The wet cleaning mechanism wipes a mask before the dry cleaning mechanism wipes the mask. Each of the wet and dry cleaning mechanisms includes a wiping module that includes a vertical plate, a feeder reel, a retriever reel, direction-changing rollers and a pushing roller. The reels and the rollers are supported on the frame. The feeder reel is adapted for holding an end of the clean-room wiper. The retriever reel is adapted for holding another end of the clean-room wiper. The direction-changing rollers are located between the feeder reel and the retriever reel and adapted for guiding the clean-room wiper to an upper portion of the wiping module. The pushing roller is adapted for pushing a portion of the clean-room wiper beyond any adjacent portion of the clean-room wiper to render the clean-room wiper ready for wiping. The wiping module of the wet cleaning mechanism further includes a sprayer mechanism adapted for spraying cleaning liquid onto the portion of the clean-room wiper on the pushing roller.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
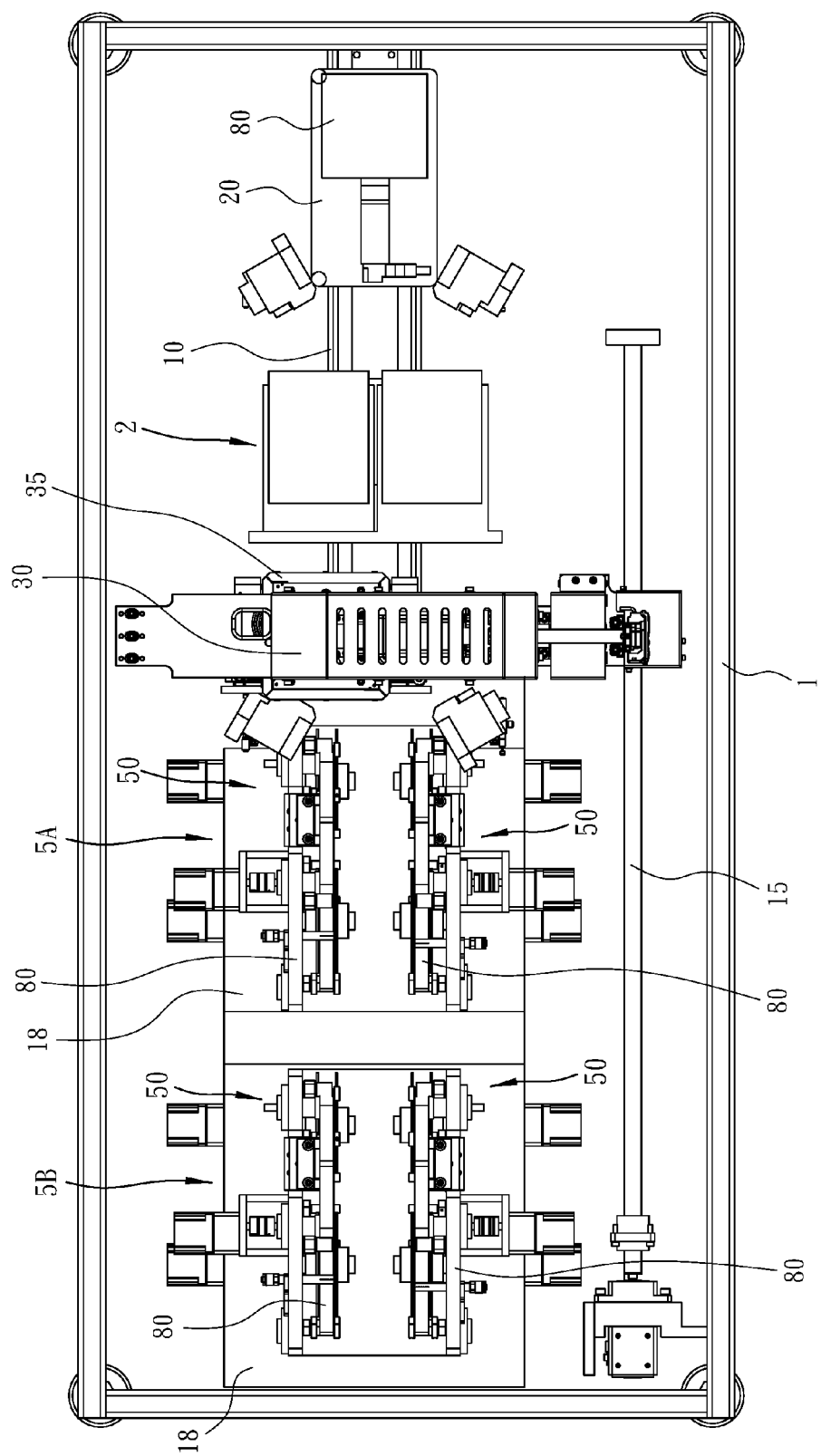
FIG. 1 is a perspective view of a mask-cleaning apparatus according to the preferred embodiment of the present invention.

Referring to FIG. 1, there is a mask-cleaning apparatus for cleaning the surface of a mask 90 and, more particularly, two opposite faces 96 of a protective film of the mask 90 via wiping according to the preferred embodiment of the present invention. The mask-cleaning apparatus can be provided on a frame 1. Also provided on the frame 1 is an optical inspector 2 for inspecting the mask 90 before and after the mask 90 is cleaned by the mask-cleaning apparatus. On a side of the frame 1, there is a pair of tracks 10 on which a mask carrier 20 slides. On another side of the frame 1, there is a track 15 on which a mask-clamping module 30 slides to and from the optical inspector 2. The mask-clamping module 30 includes a clamp 35 for holding the mask 90 by the edge while exposing a lower face 96 to the mask-cleaning apparatus. The clamp 35 can be the one disclosed in Taiwanese Patent No. M465658.

The mask-cleaning apparatus includes a wet cleaning mechanism 5A and a dry cleaning mechanism 5B. Each of the wet cleaning mechanism 5A and the dry cleaning mechanism 5B are supported on a platform 18 provided on the frame 1. The mask-clamping module 30 holds and moves the mask 90 relative to the wet cleaning mechanism 5A and the dry cleaning mechanism 5B to wash the mask 90 and wipe out water stains from the mask 90.

Figure 2:
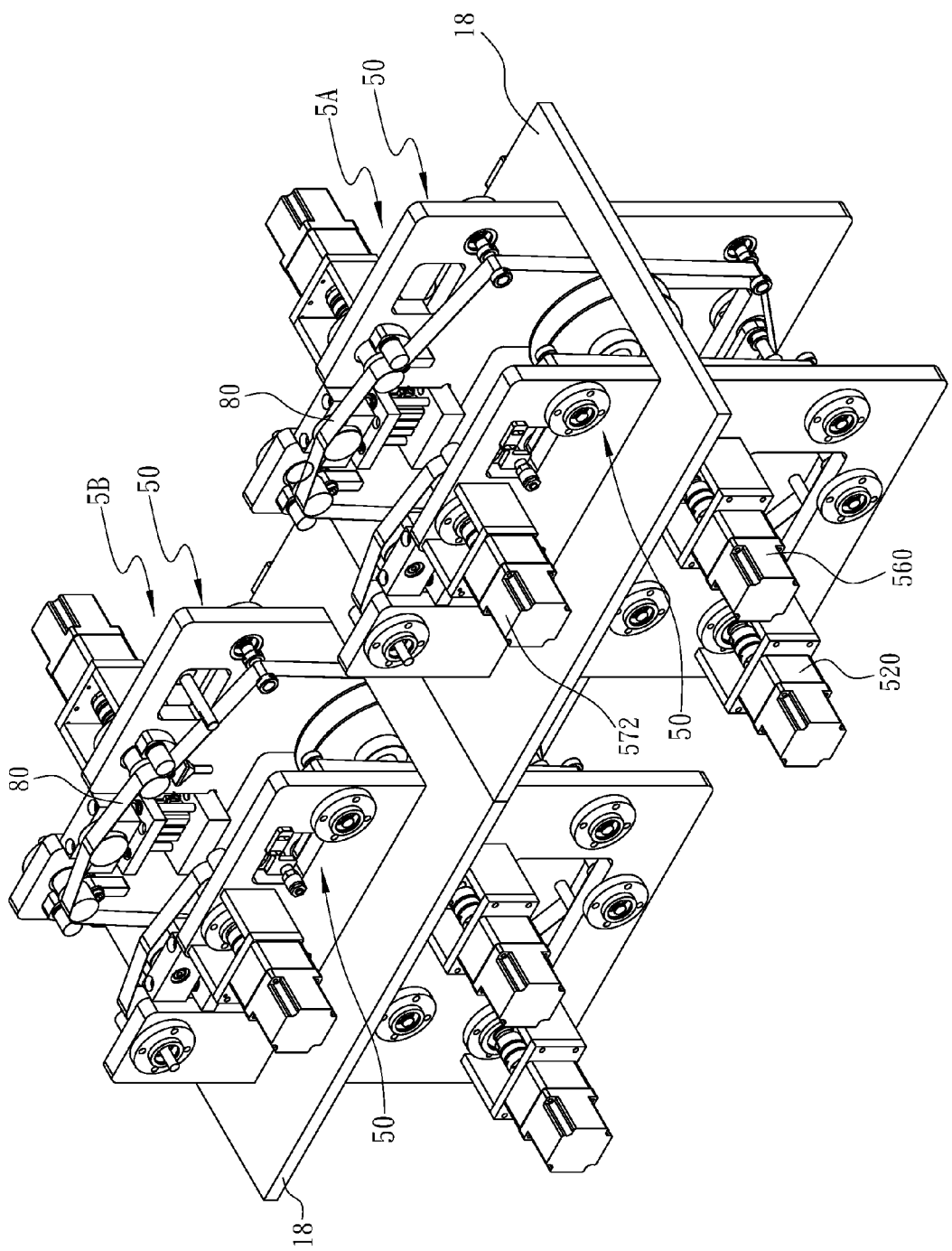
FIG. 2 is a perspective view of a wet cleaning mechanism and a dry cleaning mechanism of the mask-cleaning apparatus shown in FIG. 1.
Figure 3:
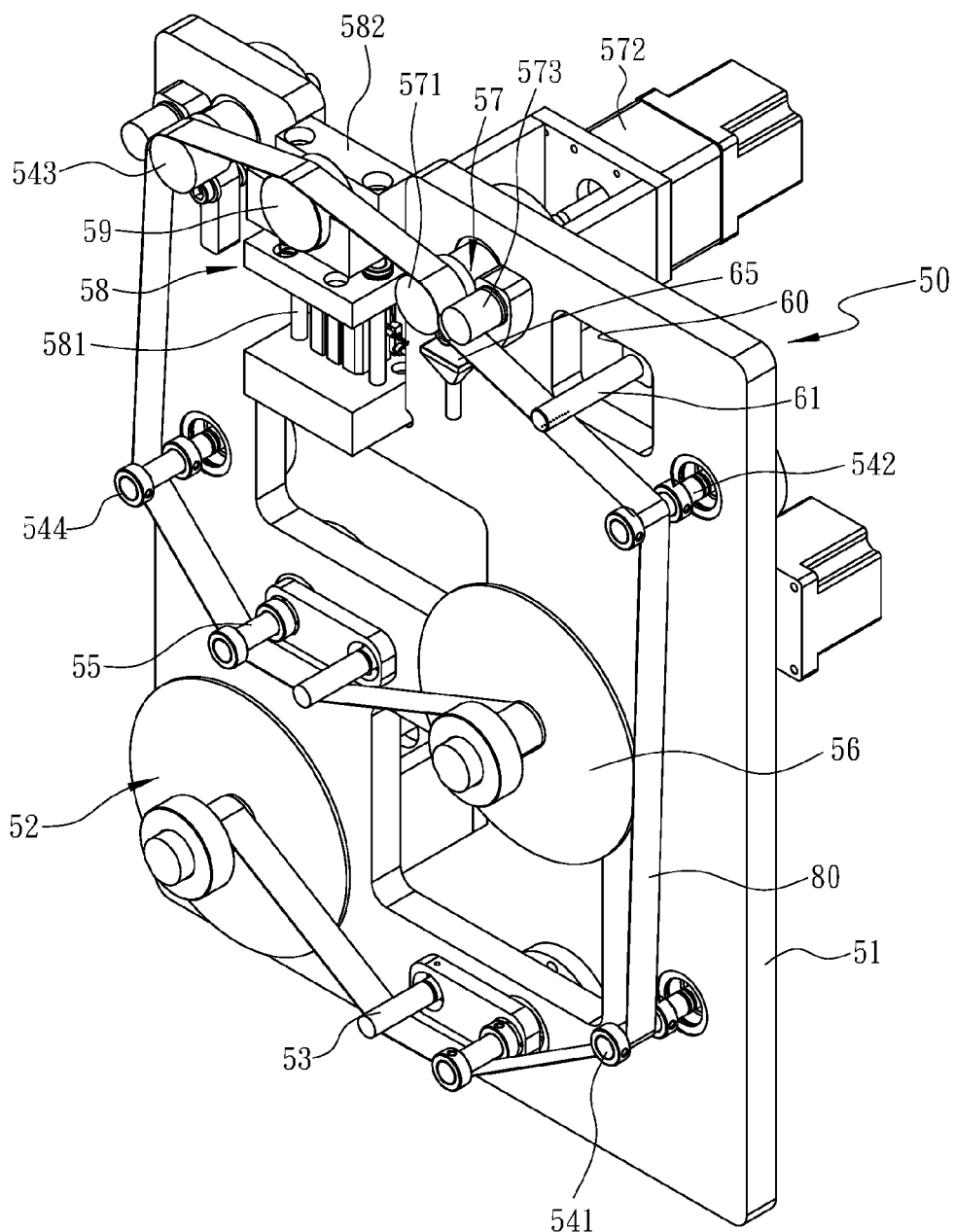
FIG. 3 is a perspective view of a wiping module of each of the wet and cleaning mechanisms shown in FIG. 2.
Figure 5:
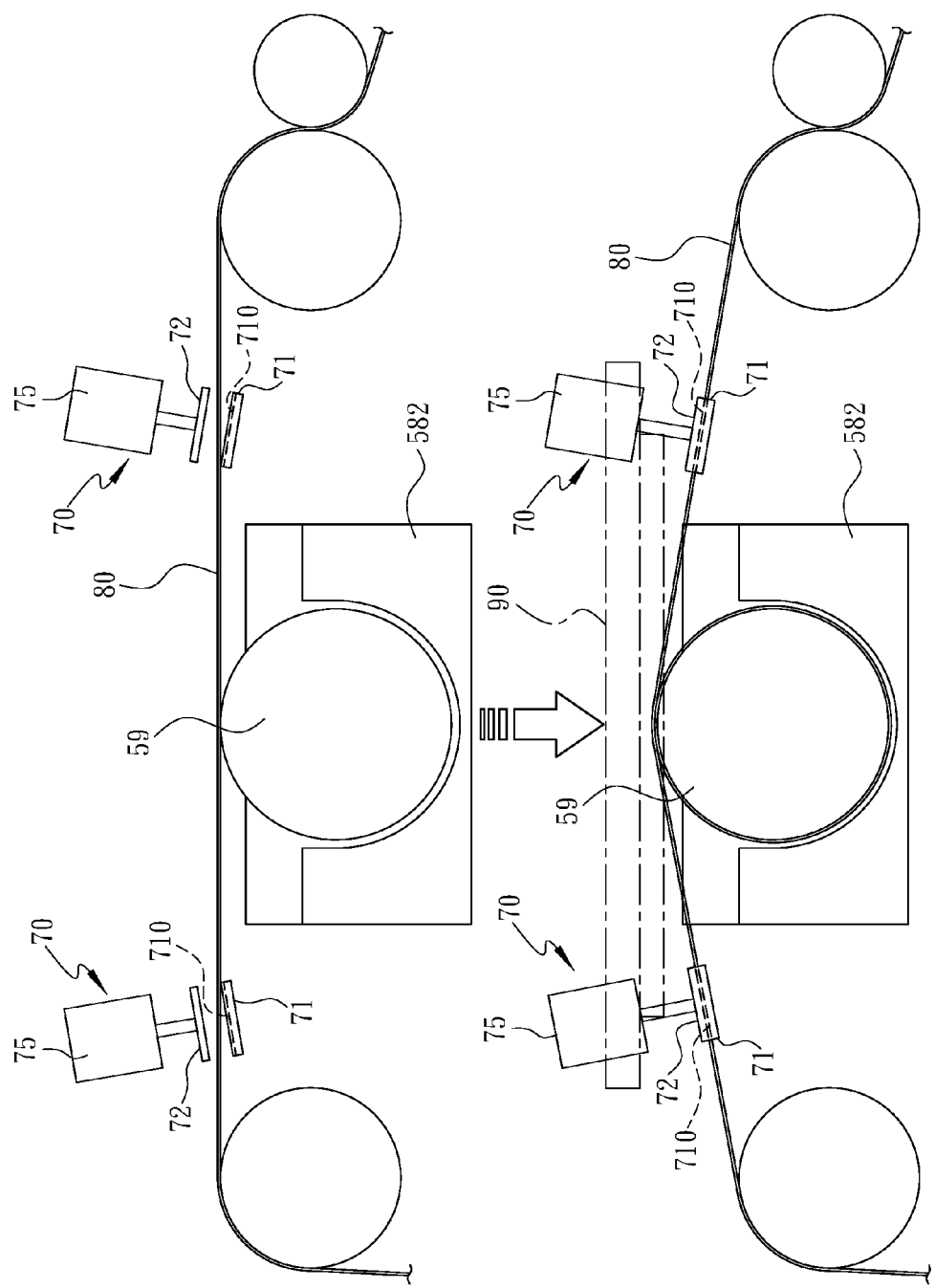
FIG. 5 is a partial view of the wiping module shown in FIG. 4.
Figure 6:
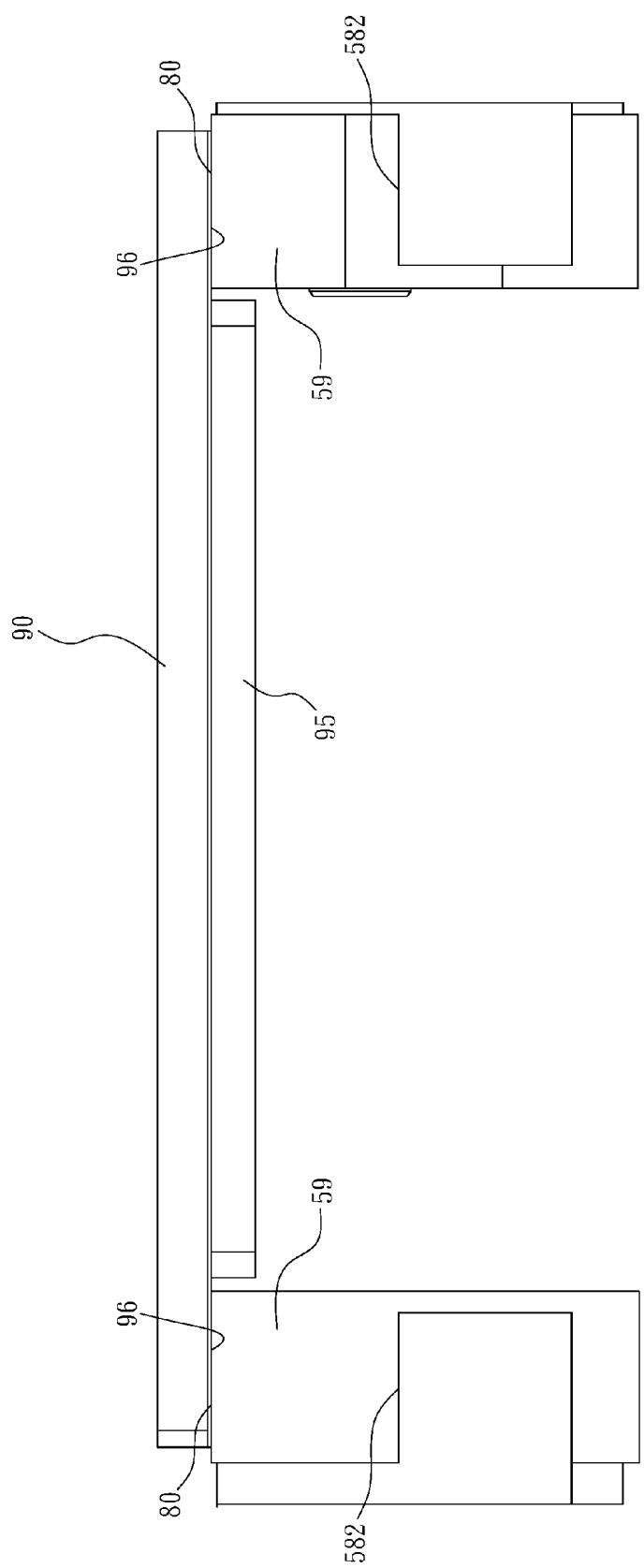
FIG. 6 is a side view of a mask wiped by a clean-room wiper run by the wiping module shown in FIG. 5.

The wet and dry cleaning mechanisms 5A and 5B will be described in detail referring to FIGS. 2, 3 and 4. Each of the wet and dry cleaning mechanisms 5A and 5B includes a wiping module 50 supported on the corresponding platform 18 provided on the frame 1 and adapted for running a clean-room wiper 80 in the form of a strip. Each of the wiping modules 50 is adapted for wiping the lower face 96 of the protective film 95 of the mask 90 as shown in FIGS. 5 and 6. For briefness and clarity, the following description will be given to only one of the wiping modules 50 and the corresponding platform 18.

The wiping module 50 includes a vertical plate 51 provided on the platform 18. On an internal side of the vertical plate 51, there are a feeder reel 52 and a retriever reel 56. The feeder reel 52 is used to hold an end of the clean-room wiper 80 while the retriever reel 56 is used to hold another end of the clean-room wiper 80. On an external side of the vertical plate 51, there are a first driver 520 and a second driver 560. The first driver 520 is used to rotate the feeder reel 52. The second driver 560 is used to rotate the retriever reel 56. The feeder reel 52 and the retriever reel 56 can be rotated in a direction to feed the clean-room wiper 80. The feeder reel 52 and the retriever reel 56 can be rotated in another direction to retrieve the clean-room wiper 80. Also on the vertical plate 51, there are two stretching rollers 53 and 55. The first stretching roller 53 is located near an output side of the feeder reel 52. The second stretching roller 55 is located near an input side of the retriever reel 56. The stretching rollers 53 and 55 render smooth the feeding and retrieving of the clean-room wiper 80. Also on the vertical plate 51, there are various direction-changing rollers 541 through 544 between the feeder reel 52 and retriever reel 56 to render smooth the movement of the clean-room wiper 80 over the wiping module 50.

There is a squeezing roller set 57 between the direction-changing rollers 542 and 543, near an upper edge of the vertical plate 51 of the wiping module 50. The squeezing roller set 57 includes a roller 571 operatively connected to a third driver 572. On a side of the roller 571, there is a squeezing roller 573 adapted for changing a force exerted on the clean-room wiper 80 to distribute the cleaning liquid evenly in the clean-room wiper 80 and squeeze an excessive portion of the cleaning liquid out of the clean-room wiper 80. A pushing roller 59 is supported on the vertical plate 51 and located after the squeezing roller set 57 in the direction of the feeding of the clean-room wiper 80. A lifting unit 58 is operatively connected to the pushing roller 59. The pushing roller 59 selectively lifts or lowers the clean-room wiper 80 before the clean-room wiper 80 wipes the mask 50 referring to FIG. 5. The lifting unit 58 includes a cylinder 581 on the vertical plate 51. The cylinder 581 includes a roller holder 582 for holding the pushing roller 59.

On the vertical plate 51 of the wiping module 50, before the squeezing roller set 57 in the direction of the feeding of the clean-room wiper 80, there is a sprayer mechanism 60 for spraying cleaning liquid. There is no need for including a sprayer mechanism 60 in the wiping module 50 of the dry cleaning mechanism 5B. However, the wiping module 50 of the dry cleaning mechanism 5B can include a sprayer mechanism 60 that is not activated. The sprayer mechanism 60 includes a sprayer 61 adapted for spraying the cleaning liquid onto the clean-room wiper 80. Moreover, the sprayer mechanism 60 includes a recycling unit 65 located below the squeezing roller set 57 and adapted for recycling an extra portion of the cleaning liquid squeezed out of the squeezing roller set 57.

Referring to FIG. 5, the wiping module 50 further includes two positioning clamp units 70 on the vertical plate 51, on two sides of the pushing roller 59. Each of the positioning clamp units 70 includes a positioning plate 71 below the clean-room wiper 80, a pressing plate 72 above the clean-room wiper 80, and a cylinder 75 operatively connected to the pressing plate 72. Between the positioning plate 71 and the pressing plate 72, there is a positioning passageway 710 with a width identical to that of the clean-room wiper 80 and a height larger than the thickness of the clean-room wiper 80. Selectively, the cylinder 75 drives the pressing plate 72 to press the clean-room wiper 80 on the positioning plate 71 of the positioning clamp unit 70 to keep the clean-room wiper 80 in position when the clean-room wiper 80 wipes the mask 90. Moreover, the positioning clamp unit 70 limits the movement of the clean-room wiper 80 in a small range to avoid dislocation of the clean-room wiper 80.

Figure 4:
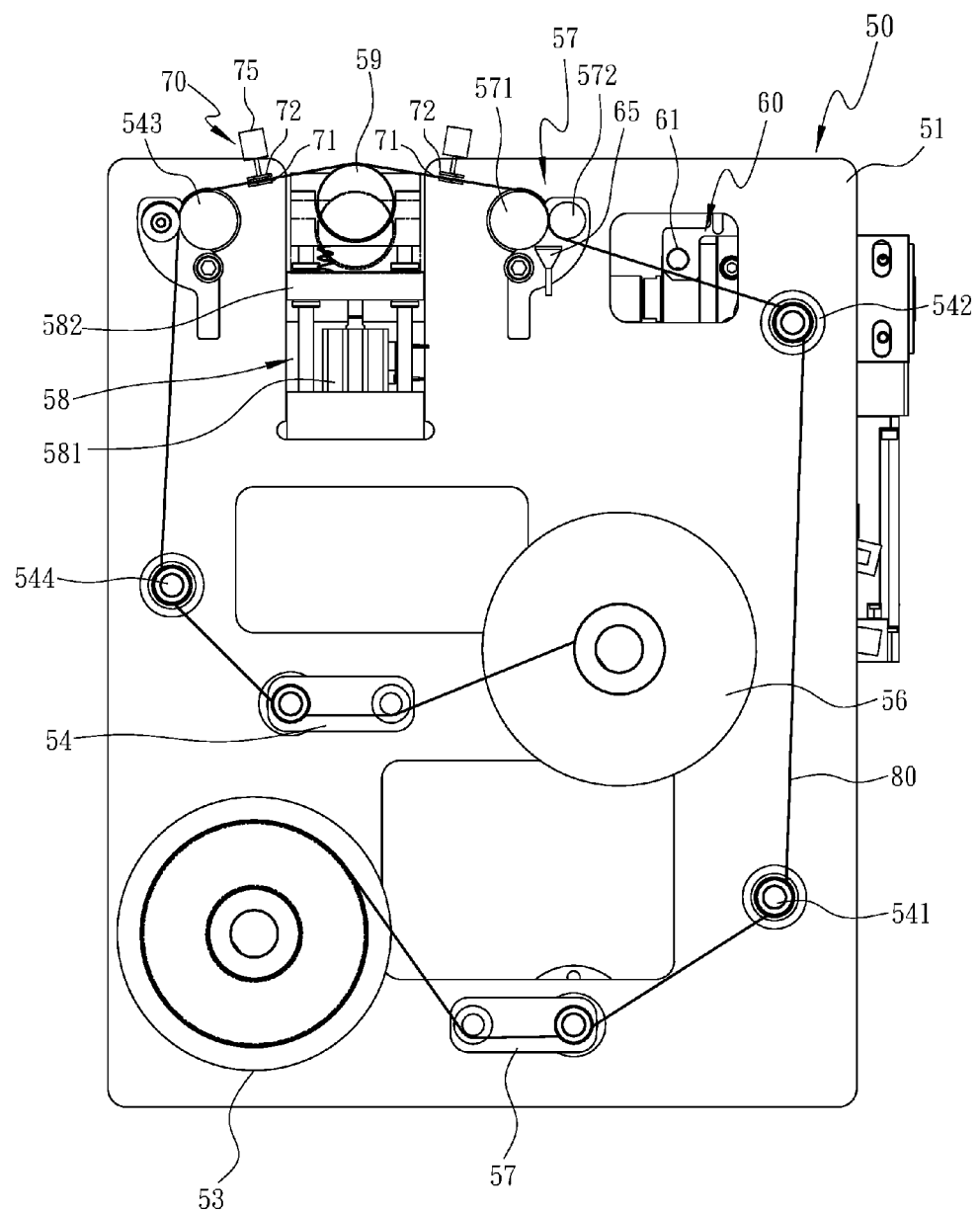
FIG. 4 is a front view of the wiping module shown in FIG. 3.

Referring to FIGS. 1 and 4, to clean the lower face 96 of the protective film 95 of the mask 90, the drivers 520, 560 and 572 of the wiping modules 50 of the wet and dry cleaning mechanisms 5A and 5B synchronously work to roll the clean-room wiper 80, with a portion of the clean-room wiper 80 located on the pushing roller 59. Now, the pressing plate 72 and the positioning plate 71 of the positioning clamp unit 70 are opened to allow the clean-room wiper 80 to smoothly travel via the positioning passageway 710 of the positioning plate 71. At the same time, the sprayer 61 of the sprayer mechanism 60 of the wet cleaning mechanism 5A is actuated to spray the cleaning liquid onto the clean-room wiper 80. When the clean-room wiper 80 travels through the squeezing roller set 57, the squeezing roller set 57 squeezes the clean-room wiper 80 to evenly distribute the cleaning liquid in the clean-room wiper 80. Thus, it is ensured that every portion of the clean-room wiper 80 contains a sufficient amount of the cleaning liquid for effective wiping, and it is avoided that water stains are left on the mask 90.

Then, the clamp 35 of the mask-clamping module 30 is actuated to clamp and move the mask 90 towards the wet cleaning mechanism 5A (or the dry cleaning mechanism 5B. Referring to FIGS. 4, 5 and 6, in each of the positioning clamp units 70 of the wiping module 50, the pressing plate 72 is moved towards the positioning plate 71 to press the portion of the clean-room wiper 80 on the pushing roller 59. Then, referring to FIG. 5, the wiping module 50 lifts the pushing roller 59 of the lifting unit 58 to make this portion of the clean-room wiper 80 protrude upwards.

Referring to FIG. 6, when the mask 90 reaches a position above the portion of the clean-room wiper 80 on the pushing roller 59 of the wiping module 50 of the wet cleaning mechanism 5A, this portion of the clean-room wiper 80 which contains the cleaning liquid wipes the lower face 96 of the protective film 95 of the mask 90, and removes particles, mist and stains from the lower face 96.

When the mask 90 reaches a position above the portion of the clean-room wiper 80 on the pushing roller 59 of the wiping module 50 of the dry cleaning mechanism 5B, this portion of the clean-room wiper 80 wipes the lower face 96 of the protective film 95 of the mask 90 to wipe out the cleaning liquid from the lower face 96. Thus, no water stain is left on the lower face 96 of the protective film 95 of the mask 90.

A wider clean-room wiper 80 can be used with the wiping module 50 of each of the wet and dry cleaning mechanisms 5A and 5B to clean an upper face 96 of glass on the mask 90.

As discussed above, the clean-room wiper 80 in each of the wet and dry cleaning mechanisms 5A and 5B directly wipes the lower face 96 of the mask 90. Hence, it quickly and effectively cleans the lower face 96 of particles or mist. The efficiency and yield of a following production process are rendered high. Furthermore, no water stain is left on the mask 90 after the wet and dry wiping, thus rendering the quality of the mask 90 high. In addition, only a small amount of cleaning liquid is used because the cleaning liquid is sprayed onto the clean-room wiper 80. The use of the mask-cleaning apparatus is hence safe, environmentally friendly, and inexpensive.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A mask-cleaning apparatus comprising a frame, a wet cleaning mechanism supported on the frame, and a dry cleaning mechanism supported on the frame and located after the wet cleaning mechanism in a direction of feeding a clean-room cleaner, wherein each of the wet and dry cleaning mechanisms comprises a wiping module comprising:
- a vertical plate supported on the frame;
- a feeder reel supported on the vertical plate and adapted for holding an end of the clean-room wiper;
- a retriever reel supported on the vertical plate and adapted for holding another end of the clean-room wiper;
- direction-changing rollers supported on the vertical plate between the feeder reel and the retriever reel and adapted for guiding the clean-room wiper to an upper portion of the wiping module; and
- a pushing roller supported on the vertical plate and adapted for pushing a portion of the clean-room wiper beyond any adjacent portion of the clean-room wiper to render the clean-room wiper ready for wiping;
- wherein the wiping module of the wet cleaning mechanism further comprises a first stretching roller supported on the vertical plate near an output side of the feeder reel and a second stretching roller supported on the vertical plate near an input side of the retriever reel so that the first and second stretching rollers cooperate with each other to render the feeding and retrieving of the clean-room wiper smooth and a sprayer mechanism adapted for spraying cleaning liquid onto the portion of the clean-room wiper on the pushing roller, wherein the wet cleaning mechanism wipes a mask before the dry cleaning mechanism wipes the mask.

2. The mask-cleaning apparatus according to claim 1, wherein each of the wet and dry cleaning mechanisms comprises two wiping modules adapted for wiping the mask.

3. The mask-cleaning apparatus according to claim 1, wherein the wiping module comprises:
- a first driver supported on the vertical plate and adapted for driving the feeder reel; and
- a second driver supported on the vertical plate and adapted for driving the retriever reel.

4. The mask-cleaning apparatus according to claim 1, wherein the wiping module comprises a lifting unit adapted for lifting the pushing roller.

5. The mask-cleaning apparatus according to claim 4, wherein the lifting unit comprises:
- a cylinder supported on the vertical plate; and
- a roller holder operatively connected to the cylinder and adapted for supporting the pushing roller.

6. The mask-cleaning apparatus according to claim 1, wherein the wiping module further comprises two positioning clamp units supported on the vertical plate, on two sides of the pushing roller.

7. The mask-cleaning apparatus according to claim 6, wherein the positioning clamp unit comprises a positioning plate and a pressing plate located below the positioning plate so that a positioning passageway is defined between the positioning plate and the pressing plate, wherein the positioning passageway is adapted for receiving the clean-room wiper.

8. The mask-cleaning apparatus according to claim 7, wherein the positioning clamp unit further comprises a cylinder adapted for moving the pressing plate towards the positioning plate to keep the clean-room wiper in position when the clean-room wiper wipes the mask.

9. The mask-cleaning apparatus according to claim 1, wherein the positioning passageway is made with a width identical to that of the clean-room wiper and a height larger than thickness of the clean-room wiper.

10. A mask-cleaning apparatus comprising a frame, a wet cleaning mechanism supported on the frame, and a dry cleaning mechanism supported on the frame and located after the wet cleaning mechanism in a direction of feeding a clean-room cleaner, wherein the wet cleaning mechanism wipes a mask before the dry cleaning mechanism wipes the mask, wherein each of the wet and dry cleaning mechanisms comprises a wiping module comprising:
- a vertical plate supported on the frame;
- a feeder reel supported on the vertical plate and adapted for holding an end of the clean-room wiper;
- a retriever reel supported on the vertical plate and adapted for holding another end of the clean-room wiper;
- direction-changing rollers supported on the vertical plate between the feeder reel and the retriever reel and adapted for guiding the clean-room wiper to an upper portion of the wiping module; and
- a pushing roller supported on the vertical plate and adapted for pushing a portion of the clean-room wiper beyond any adjacent portion of the clean-room wiper to render the clean-room wiper ready for wiping;
- wherein the wiping module of the wet cleaning mechanism further comprises a sprayer mechanism adapted for spraying cleaning liquid onto the portion of the clean-room wiper on the pushing roller and a squeezing roller set located before the pushing roller in the direction of the feeding of the clean-room wiper;
- wherein the squeezing roller set comprises:
  - an active roller supported on the vertical plate;
  - a third driver adapted for driving the roller; and
  - a squeezing roller adapted for changing a force exerted on the clean-room wiper against the active roller to distribute the cleaning liquid evenly in the clean-room wiper and squeeze an excessive portion of the cleaning liquid out of the clean-room wiper.

11. A mask-cleaning apparatus comprising a frame, a wet cleaning mechanism supported on the frame, and a dry cleaning mechanism supported on the frame and located after the wet cleaning mechanism in a direction of feeding a clean-room cleaner, wherein the wet cleaning mechanism wipes a mask before the dry cleaning mechanism wipes the mask, wherein each of the wet and dry cleaning mechanisms comprises a wiping module comprising:
- a vertical plate supported on the frame;
- a feeder reel supported on the vertical plate and adapted for holding an end of the clean-room wiper;
- a retriever reel supported on the vertical plate and adapted for holding another end of the clean-room wiper;
- direction-changing rollers supported on the vertical plate between the feeder reel and the retriever reel and adapted for guiding the clean-room wiper to an upper portion of the wiping module; and
- a pushing roller supported on the vertical plate and adapted for pushing a portion of the clean-room wiper beyond any adjacent portion of the clean-room wiper to render the clean-room wiper ready for wiping;
- wherein the wiping module of the wet cleaning mechanism further comprises a sprayer mechanism adapted for spraying cleaning liquid onto the portion of the clean-room wiper on the pushing roller;

wherein the sprayer mechanism of the wiping module of the wet cleaning mechanism further comprises a sprayer adapted for spraying the cleaning liquid onto the clean-room wiper and a recycling unit located below the sprayer to receive an excessive portion of the cleaning liquid squeezed out of the clean-room wiper by the squeezing roller set.

* * * * *